(12) United States Patent
Hanson

(10) Patent No.: US 10,559,433 B2
(45) Date of Patent: Feb. 11, 2020

(54) SWITCHING APPARATUS FOR SYNCHRONIZED TOGGLE POSITIONING AND RELATED SENSORY FEEDBACK

(71) Applicant: SWITCHDOWN LLC, Durham, ME (US)

(72) Inventor: Jonathan Bryant Hanson, Durham, ME (US)

(73) Assignee: SWITCHDOWN LLC, Durham, ME (US)

( * ) Notice: Subject to any disclaimer, the term of this patent is extended or adjusted under 35 U.S.C. 154(b) by 503 days.

(21) Appl. No.: 15/341,112

(22) Filed: Nov. 2, 2016

(65) Prior Publication Data
US 2017/0154744 A1    Jun. 1, 2017

Related U.S. Application Data

(60) Provisional application No. 62/261,435, filed on Dec. 1, 2015.

(51) Int. Cl.
| | |
|---|---|
| *H01H 47/00* | (2006.01) |
| *H01H 9/26* | (2006.01) |
| *H03K 17/97* | (2006.01) |
| *H03K 17/965* | (2006.01) |
| *H01H 23/02* | (2006.01) |
| *H01H 3/00* | (2006.01) |

(52) U.S. Cl.
CPC .............. *H01H 9/26* (2013.01); *H01H 23/02* (2013.01); *H03K 17/965* (2013.01); *H03K 17/97* (2013.01); *H01H 2003/008* (2013.01); *H01H 2300/03* (2013.01); *H01H 2300/038* (2013.01); *Y02B 90/224* (2013.01); *Y04S 20/14* (2013.01)

(58) Field of Classification Search
None
See application file for complete search history.

(56) References Cited

U.S. PATENT DOCUMENTS

| | | | |
|---|---|---|---|
| 3,238,343 A | 3/1966 | Carlson | |
| 3,697,905 A * | 10/1972 | Athans, Jr. | ............... H01H 3/28 335/1 |
| 4,194,182 A | 3/1980 | Martin | |
| 4,515,518 A * | 5/1985 | Gilbert | .................. B60P 1/6445 280/43.23 |

(Continued)

*Primary Examiner* — Stephen W Jackson
(74) *Attorney, Agent, or Firm* — Leber IP Law; David C. Robertson

(57) ABSTRACT

An electrical switching device for controlling lighting or other electrical loads from multiple locations. Device toggle element indicates to a user whether or not the load is energized. A raised "ON" position indicates an energized load while lowered "OFF" position indicates the load is not energized. Toggle element position is changeable manually by the user or programmatically by an actuator mechanism. A mode of communication exists among devices so that when one device's toggle element position is changed manually, this change is communicated to other devices on the same circuit and these other devices activate their actuator in order to change the position of their toggle elements in synchronization. One or more loads are connected to devices and are energized when the respective device's toggle element is in the raised "ON" position and de-energized when the device's toggle element is in the lowered "OFF" position.

15 Claims, 12 Drawing Sheets

(56) References Cited

U.S. PATENT DOCUMENTS

| | | | |
|---|---|---|---|
| 5,239,205 A * | 8/1993 | Hoffman | H01H 23/00 200/277.2 |
| 5,340,954 A | 8/1994 | Hoffman et al. | |
| 5,818,128 A | 10/1998 | Hoffman et al. | |
| 6,124,771 A | 9/2000 | Kim et al. | |
| 6,714,106 B1 * | 3/2004 | Czamecki | H01H 3/22 200/331 |
| 7,088,096 B2 | 8/2006 | Etherington et al. | |
| 7,233,313 B2 | 6/2007 | Levin et al. | |
| 7,268,536 B2 | 9/2007 | Hagino et al. | |
| 7,872,377 B2 | 1/2011 | Wilson | |
| 7,888,823 B2 | 2/2011 | Den Ridder | |
| 8,084,700 B1 * | 12/2011 | Massaro | H01H 3/26 200/38 R |
| 8,130,482 B2 | 3/2012 | Yang | |
| 8,334,688 B2 | 12/2012 | Quinn | |
| 8,373,313 B2 | 2/2013 | Garcia et al. | |
| 9,054,465 B2 | 6/2015 | Hodges | |
| 2007/0176788 A1 * | 8/2007 | Mor | G08C 17/02 340/13.24 |
| 2013/0161167 A1 | 6/2013 | Roberts | |

* cited by examiner

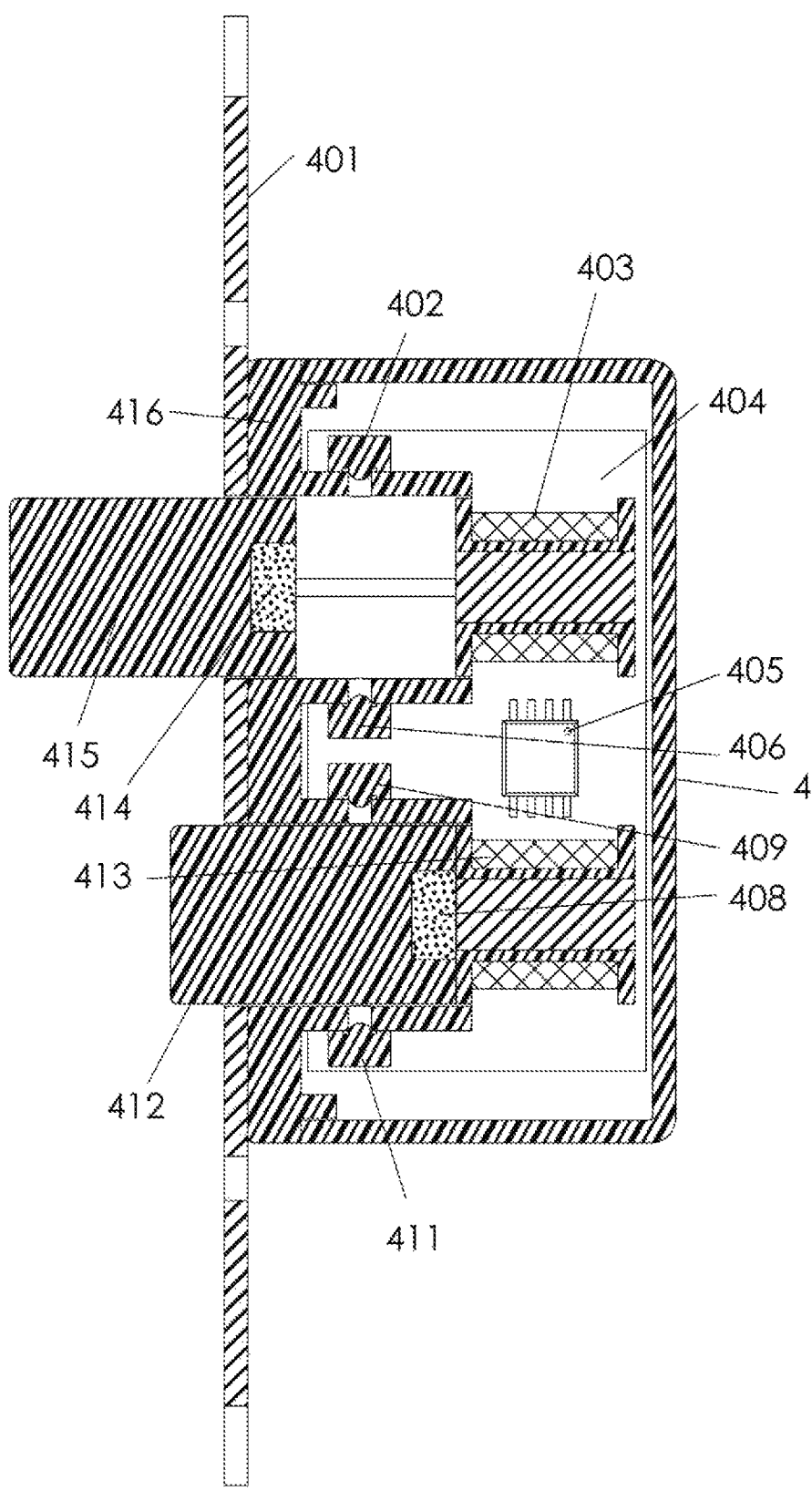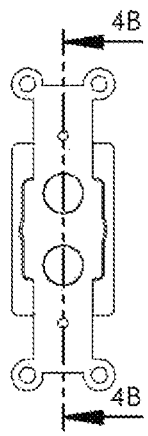
Fig 4C
Fig. 4B

SWITCHING APPARATUS FOR SYNCHRONIZED TOGGLE POSITIONING AND RELATED SENSORY FEEDBACK

RELATED APPLICATIONS

The present invention claims priority from U.S. Provisional Application No. 62/261,435 filed 1 Dec. 2015, the contents of which are herein incorporated by reference in its entirety.

FIELD OF INVENTION

The present invention relates generally to switched control of electrical loads. More particularly, the present invention relates to a multiway switch that synchronizes a position of a toggle element to provide a user with an indication of load status.

BACKGROUND OF THE INVENTION

Many light fixtures are controlled by a single switch. In these cases, it is standard practice that the switches are mounted such that the toggle element is in a raised position when the light is energized and in a lowered position when the light is not energized. In some cases, however it is necessary for light fixtures to be controlled by multiple switches. For example, the National Electrical Safety Code (NESC) requires that a stairway have a switch at each end of the stairway to energize the lighting in that space. In situations where multiple switches control the same light fixture(s), those switches must be multiway switches.

Due to the inherent design of current multiway switches, such multiway switches do not share the aforementioned standard practice that the switch's toggle element is in a raised position when the light is energized and in a lowered position when the light is not energized. Rather, a multiway switch's toggle element may be in either a raised or lowered position when the light is energized. Conversely, a multiway switch's toggle element may be in either a raised or lowered position when the light is not energized. Additionally, a multiway switch's toggle element may be in the raised position when the light is energized, but at a later time still be in the raised position, though with the light no longer energized.

The aforementioned lack of correlation between switch position and light energization causes the user a number of inconveniences. In such instances, a user may observe the toggle element of multiway switch in the raised position when the light is not energized. As such, the user may mistakenly conclude that the light is burned out.

Often multiple light switches are grouped together at a single location. A user wanting to turn off all of the lights in a particular area may place all the switches' toggle elements in the lowered position to accomplish this. However, if one or more multiway switches are present the user may inadvertently energize a light fixture.

Users may instinctively sweep their hand or arm over the toggle element of a light switch in an upward or downward manner without looking at the switch because the state of the light leads them to believe that the toggle element should be in a certain position. When a multiway switch is present, the toggle element may be in a position that the user does not expect, rendering their motion ineffective.

Users may also sweep their hand or arm over the toggle element of a light switch in an upward or downward manner when they cannot see the toggle element, such as in a dark room. As in the previous case, this motion may be ineffective.

Users may desire to control a light fixture that is out of sight, such as a light that is on the other side of a door. Users will be compelled to move to a location to where they can observe the state of the light to confirm that they have placed the light in the desired state.

Because this lack of correlation between the toggle element position and the energization of the light exists, users may also question the state of switches which are not multiway switches. As it is not readily apparent whether a switch is a multiway switch or a regular switch, users may doubt the status of a switch that does indeed have a correlation between switch position and energization of the light.

U.S. Pat. No. 3,238,343 issued to Carlson attempted to address this shortcoming with an illuminated pushbutton. However, this solution required extra wiring and introduced an interface that was unfamiliar to the user.

Given these factors, there is a clear need for a switching apparatus that overcomes the limitations of the prior art.

SUMMARY OF THE INVENTION

The present invention is a switch which is intended to be used in combination with one or more switches of the same type in multiple locations to control an electrical load. In typical situations, the electrical load may be a lighting load in terms of a light fixture though any electrical load may be provided.

The present invention includes a toggle element which may be in the form of a lever, rocker, or pushbutton structure. Such toggle element serves both as the user interface for controlling an electrical load and also an indicator of the energization state of the load, which is switchable between a raised "ON" position and a lowered "OFF" position. One or more actuating devices are provided which both serve to change the position of the toggle element and to provide the user with a snap-action feel (i.e., haptic feedback). A communication mechanism is also provided that serves to synchronize the switching devices. As well, a microcontroller that processes communication messages, senses the position of the toggle element, and controls the actuating devices is provided thereby controlling the position of the toggle element.

In one embodiment, a permanent fixed magnet is affixed to the interior end of the toggle element. One or more electromagnets are mounted so as to selectively produce a repelling and/or attracting force on the permanent magnet in order to move the toggle element into an appropriate position.

In another embodiment, one or more blocks of ferrous material is/are mounted in the body of the toggle element. One or more electromagnets is/are mounted so as to produce an attracting force on the ferrous material in order to move the toggle element into an appropriate position.

In one embodiment, a Hall Effect sensor is placed in a position whereby a permanent magnet embedded in the toggle element will change the output state of the Hall Effect sensor. The Hall Effect sensor and the permanent magnet are placed in such a way that the output state of the Hall Effect sensor changes when the toggle element passes the midpoint of the toggle element's travel. In this way, the microcontroller will accurately detect if the toggle element is in the raised or lowered half of the toggle element's travel.

In another embodiment, a beam of light is emitted from a light source. A light detector is placed opposite the light source. The light source and sensor are placed in such a way that the toggle element interrupts the light beam and subsequently changes the output of the light detector when the toggle element passes the midpoint of the toggle element's travel. In this way, the microcontroller will accurately detect if the toggle element is in the raised or lowered half of the toggle element's travel.

In another embodiment, the toggle element depresses a limit switch and subsequently changes the output of the limit switch when the toggle element passes the midpoint of the toggle element's travel. In this way, the microcontroller will accurately detect if the toggle element is in the raised or lowered half of the toggle element's travel.

In one embodiment, a line terminal and a load terminal are present with a switching device provided between the two terminals. By changing the state of this switching device, the microcontroller will control the energization of the load.

In one embodiment, a communication wire is present which will be wired to a communication wire of one or more like devices. In this way, electrical signals are passed between the devices and the devices communicate synchronization messages. When the microcontroller receives a message via the communication terminal that a change of state is required, the microcontroller will energize the electromagnets in order to produce a magnetic force and subsequently move the toggle element to the appropriate position.

In one embodiment, the toggle element protrudes from the front of the switch and has between a 40 degree to 50 degree range of movement between a raised "UP" position and a lowered "OFF" position. The microcontroller will detect when the toggle element passes the midpoint of lever travel and change the output of the load terminal to match the state of the toggle element's position. When the position is changed, the microcontroller will also send out a message via the microcontroller's communication terminal to inform other like devices of the change of state.

In another embodiment, the toggle element is nearly flush with the face of the switch and has a range of movement from 5 degrees to 12 degrees, pivoting in the center. Only the top or bottom edge of the toggle element protrudes at a given time. When the bottom half of the toggle element is flush with the face of the switch, the switch is in the "OFF" position. When the top half of the toggle element is flush with the face of the switch, the switch is in the "ON" position. When the position is changed, the microcontroller will also send out a message via the microcontroller's communication terminal to inform other like devices of the change of state.

In another embodiment, the switch has two pushbuttons, only one of which protrudes at a given time. When the top button is depressed flush with the face of the switch, the switch is in the "ON" position. When the bottom button is depressed flush with the face of the switch, the switch is in the "OFF" position. When a user depresses the button which is in the protruding position, the button which is in the depressed position will simultaneously protrude. In this way, the two pushbuttons act in a toggle manner. When the position is changed, the microcontroller will also send out a message via the microcontroller's communication terminal to inform other like devices of the change of state.

In accordance with one aspect, the present invention provides a switching apparatus for controlling energization of an electrical load, the apparatus including: a toggle element movable between a first position and a second position, the toggle element including a magnetic element affixed thereto; an electromagnetic element being selectively energized and fixed in position relative to the toggle element; a sensor creating a signal indicative of the toggle element passing a position midway between the first position and the second position; and a microprocessor controlling the electromagnetic element to selectively attract or repel the magnetic element in response to the signal thereby creating sensory feedback to a user of the switching apparatus between energization and de-energization of an electrical load.

In accordance with another aspect, the present invention provides a system of controlling energization of an electrical load using multiple switch devices, the system including: a plurality of switch devices, each the switch device including a toggle element movable between a first position and a second position, the toggle element including a magnetic element affixed thereto; an electromagnetic element being selectively energized and fixed in position relative to the toggle element; a sensor creating a signal indicative of the toggle element passing a position midway between the first position and the second position; a communications wire for distributing the signal among the plurality of switches; and a microprocessor controlling the electromagnetic element to selectively attract or repel each the magnetic element in each of the plurality of switches simultaneously in response to the signal thereby creating sensory feedback to a user of the system; wherein the plurality of switches are connected via the communications wire.

This brief summary has been provided so that the nature of the invention may be understood quickly. A more complete understanding of the invention can be obtained by reference to the following detailed description of the preferred embodiment thereof in connection with the attached drawings.

BRIEF DESCRIPTION OF THE DRAWINGS

The above and other aspects, features, and advantages of the present disclosure will become more apparent in light of the following detailed description when taken in conjunction with the accompanying drawings in which:

FIG. 4B is a side cross-sectional view of the switch taken along cutline 4B-4B of FIG. 4C;

FIG. 4C is a frontal view of the switch shown in FIGS. 4A and 4B;

DETAILED DESCRIPTION

Preferred embodiments of the present disclosure will be described herein with reference to the accompanying drawings. In the following description, well-known functions or constructions are not described in detail to avoid obscuring the invention in unnecessary detail.

Figure 1A:
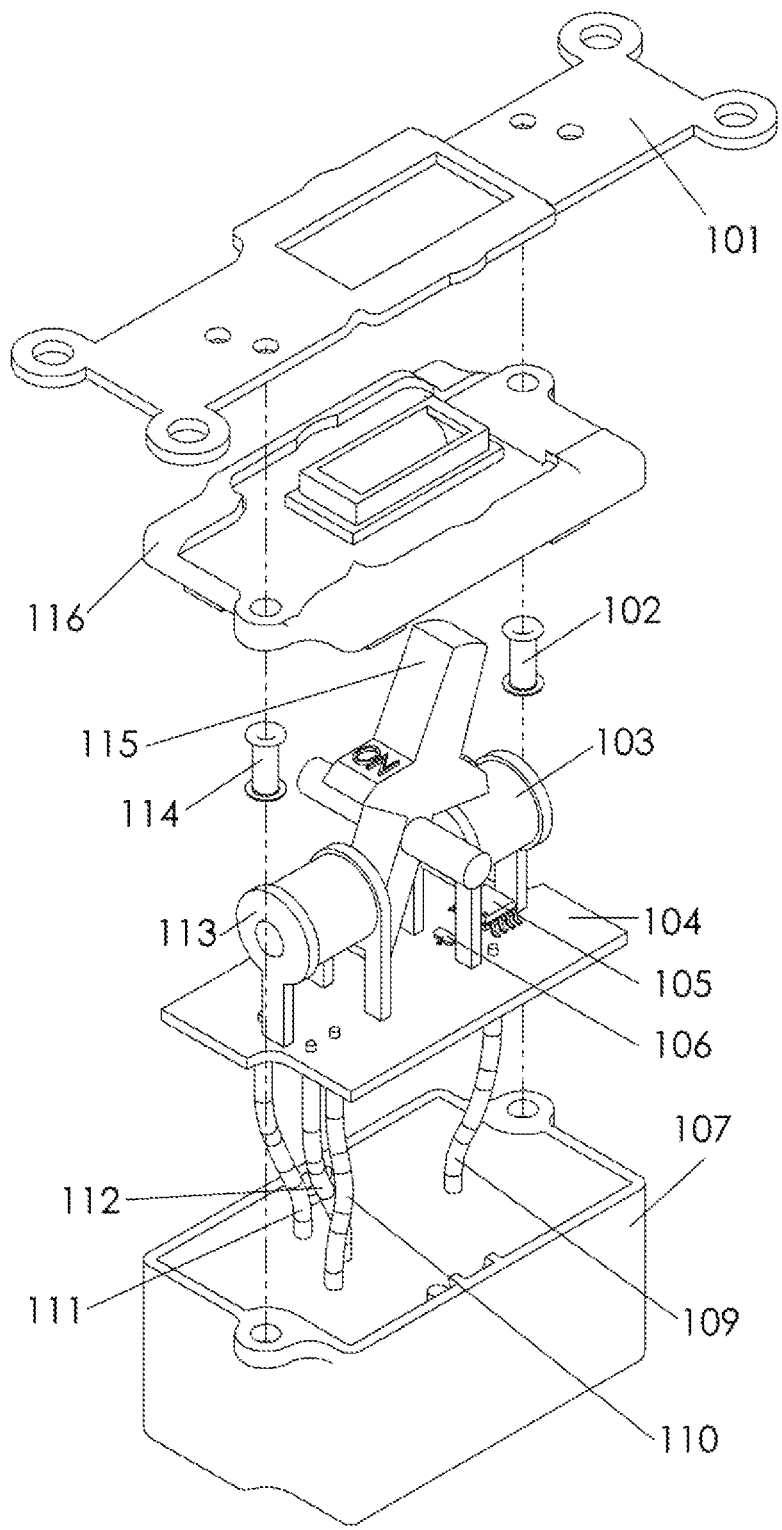
FIG. 1A is a cutaway perspective view of a switch device in accordance with one embodiment of the present invention.
Figures 1B, 1C:
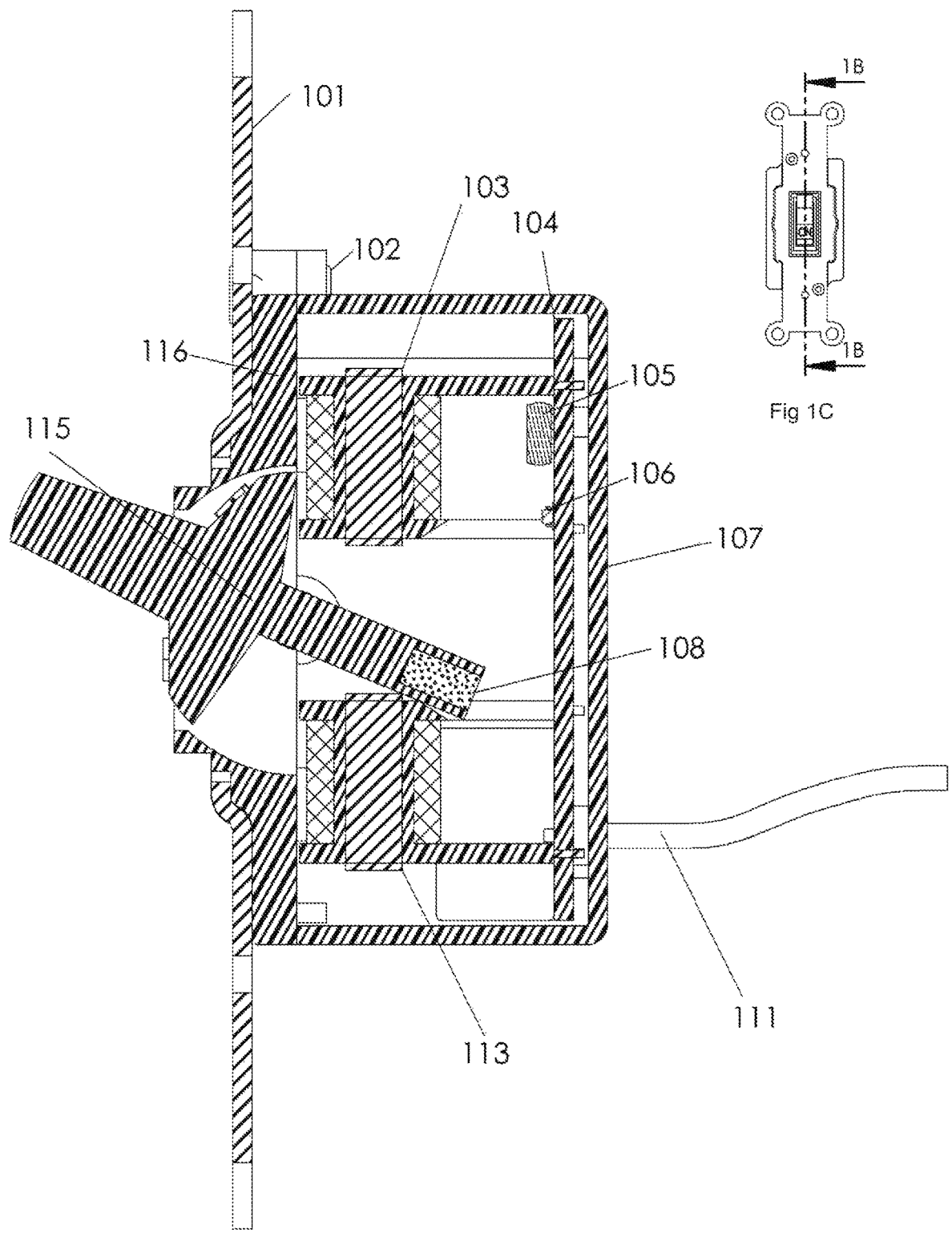
FIG. 1B is a side cross-sectional view of the switch taken along cutline 1B-1B of FIG. 1C.
FIG. 1C is a frontal view of the switch shown in FIGS. 1A and 1B.

Referring to FIGS. 1A through FIG. 1C, a switch in accordance with a first embodiment of the present invention is shown and described. Here, a toggle element 115 is the user interface device. This toggle element 115 allows the user to control the energization of the load by moving to either the raised "ON" position or the lowered "OFF" position. It should be understood that while the customary standard of a raised (i.e., "up") position is used to indicate an energization (i.e., "ON" position) of the load and a lowered (i.e., "down") position is used to indicate an de-energization (i.e., "OFF" position) of the load, any suitable positioning model may be used to indicate energization and de-energization of the load without straying from the intended scope of the present invention including, but not limited to, left/right orientation or, in the case of push-button style switching, in/out orientation. This toggle element 115 serves as a visual indicator to the user because the position of the toggle element 115 corresponds with the energization state of the lighting load. Advantageously, the toggle element 115 also provides the user with haptic feedback as the toggle element 115 provides a tactile snap action by resisting the manual movement of the user until the toggle element 115 reaches a midway of the toggle element's 115 travel, where the toggle element 115 snaps into the position (i.e., ON to OFF, or vice versa) that the user is moving the toggle element 115.

A pair of electromagnets 103, 113 are provided to supply magnetic force in order to selectively attract/repel a permanent magnet 108 (seen in the cross sectional view of FIG. 1B which itself is the view taken along line 1B-1B shown in FIG. 1C) which is embedded in the toggle element 115. Those of skill in the art will appreciate that the magnetic force may alternatively be supplied with a single horseshoe electromagnet without straying from the intended scope of the present invention.

A microcontroller 105 is configured so as to selectively provide direct current (DC) through the electromagnets 103, 113 and thereby move the position of the toggle element 115. In this manner, the permanent magnet 108 embedded in the toggle element 115 allows the electromagnets 103, 113 to apply a force on the toggle element 115 in order to move the toggle element's 115 position. The permanent magnet 108 has a magnetic field surrounding the permanent magnet 108 which will be detected by a Hall Effect sensor 106 located adjacent an internal end of the toggle element 115, wherein the external end thereof is the end exposed to the user. When the toggle element 115 passes the midpoint of the toggle element's 115 arcuate path of travel, the output of the Hall Effect sensor 106 is changed. Such change in output is detected by the microcontroller 105. It will be appreciated by those of skill in the art that this position sensor could be in a form other than a Hall Effect sensor and may include a momentary contact, light detector, or other sensing device without straying from the intended scope of the present invention.

The haptic feedback provided by the toggle element 115 is produced by the force (i.e., attracting or repelling) of the electromagnets 103, 113 on the permanent magnet 108. When the switch's toggle element 115 is in a given position, the microcontroller 105 detects the position and controls the electromagnets 103, 113 to continue providing force to keep the toggle element 115 in that same position. In this way, when the user places a force (e.g., manually with the user's hand) against the toggle element 115, there is an active countering force on the toggle element 115 working against the user applied force. When the toggle element 115 reaches the midpoint of the toggle element's 115 travel, the microcontroller 105 detects the change in position and controls the electromagnets 103, 113 to reverse polarity and thereby reverse the direction of force (i.e., attracting or repelling) that the electromagnets 103, 113 place on the permanent magnet 108 and subsequently the toggle element 115. After such midpoint position is reached, the toggle element 115 then snaps into place in the direction the user was manually forcing the toggle element 115, giving the user a clear and immediate feedback that the switch's toggle element 115 has been moved to the desired position.

Line 110, load 112, neutral 111, and traveler 109 wires, each commonly understood within the electrical art, attach to the printed circuit board (PCB) and carry those conductors out of the device. Use of the traveler 109 wire in the context of the present invention will be further described herein below.

The switch face 116, mounting plate 101, switch body 107, and rivets 102, 114 are structural elements that serve to securely encase the internal elements and provide a manner commonly understood within the electrical art by which to mount the switch.

Figure 2A:
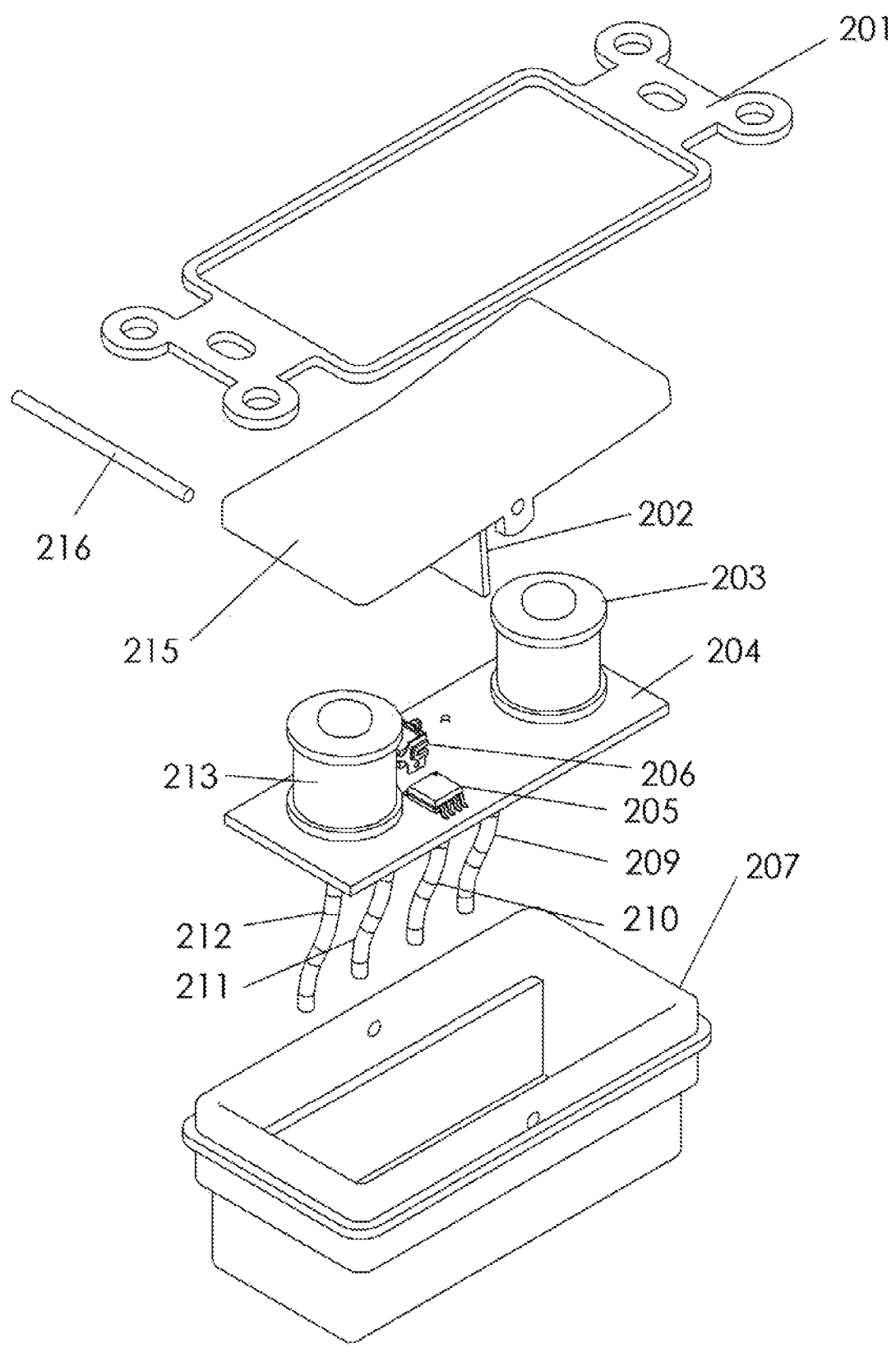
FIG. 2A is a cutaway perspective view of another (Decora® style) embodiment of the present invention.
Figures 2B, 2C:
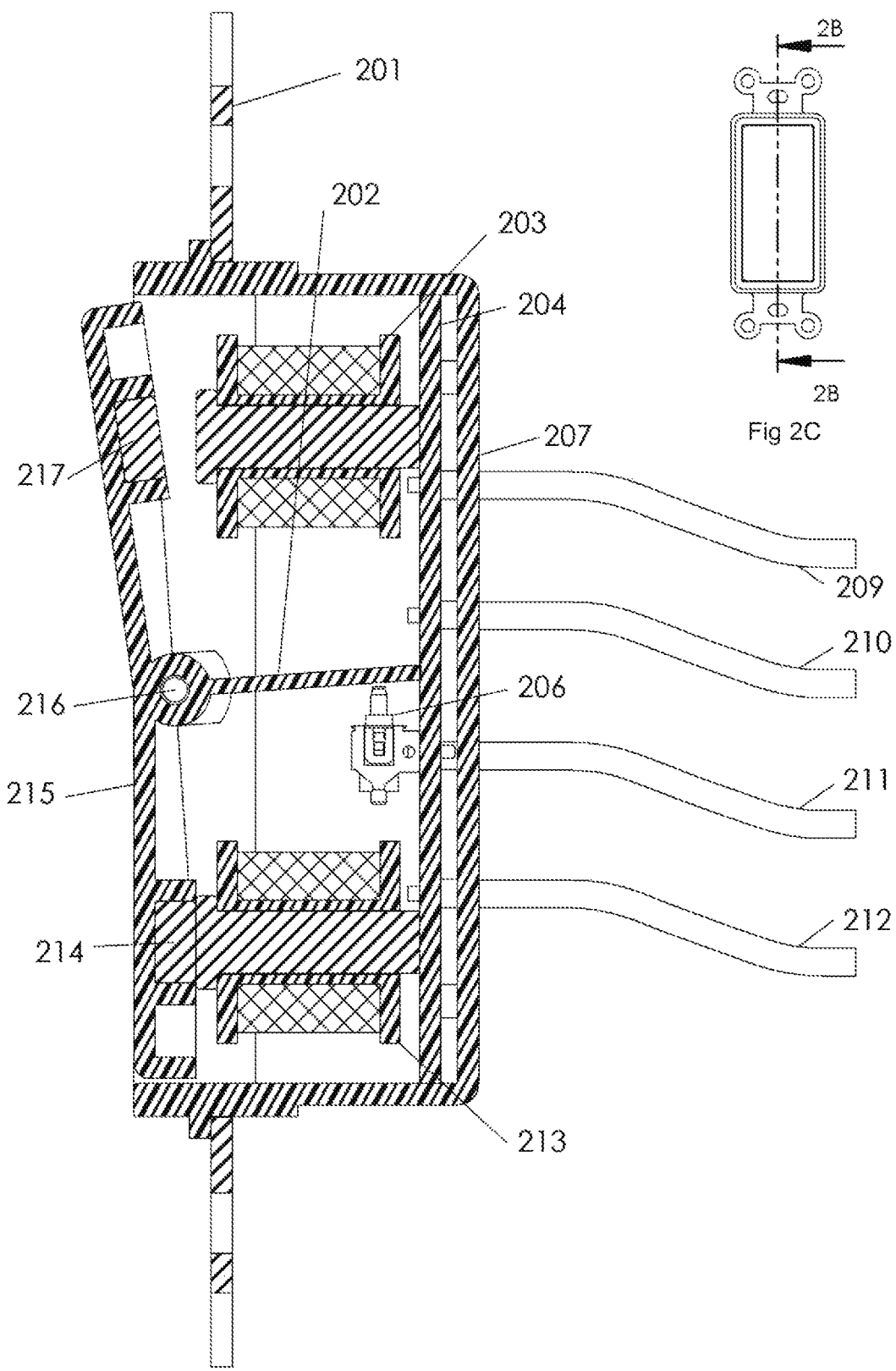
FIG. 2B is a side cross-sectional view of the switch taken along cutline 2B-2B of FIG. 2C.
FIG. 2C is a frontal view of the switch shown in FIGS. 2A and 2B.

In the embodiment represented in FIGS. 2A through FIG. 2C, the toggle element 215 conforms to the standards of a rocker switch of the Decora® style (a relatively flat-styled rocker switch provided by Leviton Mfg. Company Inc. of Melville, New York). This type of toggle element 215 as shown is therefore larger and flatter than the aforementioned toggle element 115 from FIGS. 1A through FIG. 1C. However, the toggle element 215 serves the same functional and visual purposes as the toggle element 115 from FIGS. 1A through FIG. 1C. Typically, when the upper half of the toggle element 215 is depressed to a position flush with the face of the body 207, the device is considered to be in the "ON" position and when the lower half of the toggle element 215 is depressed to a position flush with the face of the body 207, the device is considered to be in the "OFF" position. However, it should of course be understood that orientation of the lever may be altered such that ON and OFF may correspond to right/left, top/bottom, bottom/top depending upon the desired implementation.

The toggle element 215 pivots on a pin 216 at the center of the toggle element 215. It will be appreciated by those of skill in the art that this pin could be integrated as part of the toggle element 215 without straying from the intended scope of the present invention. Similar to the operation described hereinabove with regard to FIGS. 1A through FIG. 1C, this larger, flatter toggle element 215 will also provide the user with haptic feedback as the toggle element 215. As before, the toggle element 215 provides snap action by resisting the movement of the user until the toggle element 215 reaches the midway of the toggle element's 215 travel, where the toggle element 215 snaps into the position that the user is moving the toggle element 215.

A pair of electromagnets 203, 213 selectively provide attractive force thereby pulling against the ferrous material blocks 217, 214 (seen in the cross sectional view of FIG. 2B which itself is the view taken along line 2B-2B shown in FIG. 2C) which are embedded in the toggle element 215 towards ends thereof. The microcontroller 205 (seen in the FIG. 2A) selectively provides alternating current through one of the two electromagnets 203, 213 and thereby moves the position of the toggle element 215 by rocking motion which pivots about the pin 216.

The haptic feedback provided by the toggle element 215 is produced by the attractive force of the electromagnets 203, 213 on the ferrous material blocks 217, 214 which are embedded in the toggle element 215. When the switch's toggle element 215 is in a given position, the microcontroller 205 detects the position and energizes one of the two electromagnets 203, 213 to continue providing force to keep the toggle element 215 in that same position. For example, as shown in FIG. 2B, the electromagnet 213 is energized so as to attract corresponding ferrous material block 214 while the electromagnet 203 is left de-energized thereby not attracting the corresponding ferrous material block 217. In this way, when the user places a force (e.g., manually by a user's fingers) against the toggle element 215 in the raised side near ferrous material block 217, there is an opposing force on the toggle element 215 working against the user's force via the attraction of ferrous material block 214 to energized electromagnet 213.

After the user's manual force enables pivoting action of the toggle element 215 about the pin 216 and whereupon the toggle element 215 reaches the midpoint of the toggle element's 215 travel, the microcontroller 205 detects the change in position and energizes the electromagnet of electromagnets 203, 213 which was previously de-energized while simultaneously de-energizing the electromagnet of electromagnets 203, 213 which was previously energized. In this way, the direction of force the electromagnets 203, 213 place on the ferrous material blocks 217, 214 and subsequently the toggle element 215 is reversed. The toggle element 215 thereby snaps into place in the direction the user was forcing the toggle element 215, thus providing the user a clear tactile feedback that the switch's toggle element 215 has been moved to the desired position. Indeed, the snap action in most instances may also provide an audible snapping sound which provides further sensory feedback to the user of the change in switch status.

Detection by the microcontroller 205 of the change in position of the toggle element 215 may be accomplished in a variety of ways without straying from the intended scope of the present invention. In the embodiment as shown in FIG. 2B, the toggle element 215 has an extension 202 which serves to depress or release a limit switch 206 based on the position of the toggle element 215. When the toggle element 215 passes the midpoint of its travel, the output of the limit switch 206 is therefore changed, whereupon such change will be detected by the microcontroller 205. It will be appreciated by those of skill in the art that this position sensor could be in the form of a momentary contact, Hall Effect sensor, light detector, or other sensing device.

Line 209, load 210, neutral 211, and traveler 212 wires, each commonly understood within the electrical art, attach to the printed circuit board (PCB) 204 and carry those conductors out of the device. Use of the traveler 212 wire in the context of the present invention will be further described herein below.

The switch body 207 and mounting plate 201 are structural elements that serve to securely encase the internal elements and provide a manner commonly understood within the electrical art by which to mount the switch.

Figure 3A:
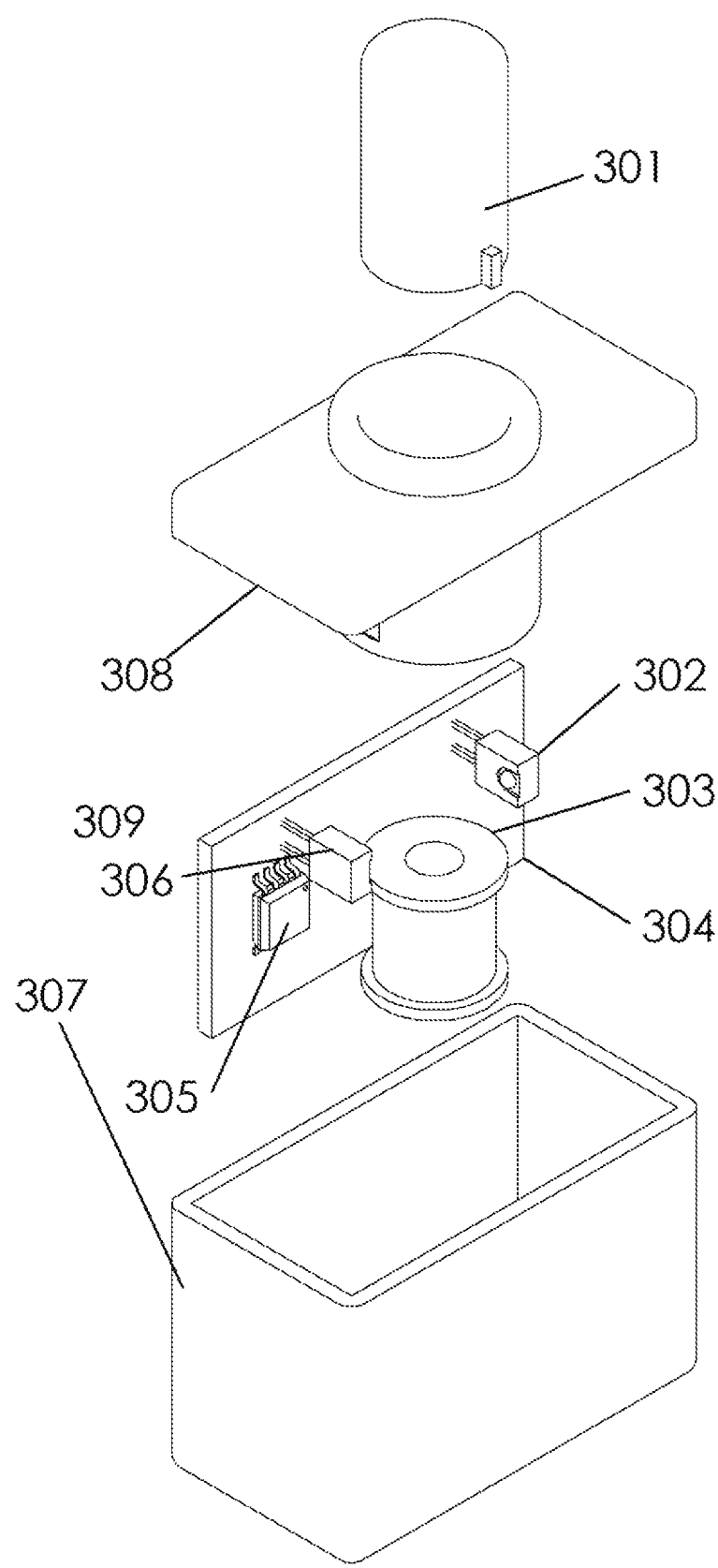
FIG. 3A is a cutaway perspective view of another (single momentary pushbutton) embodiment of the present invention.
Figure 3C:
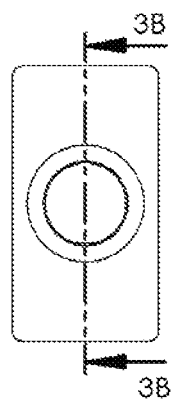
FIG. 3C is a frontal view of the switch shown in FIGS. 3A and 3B.
Figure 3B:
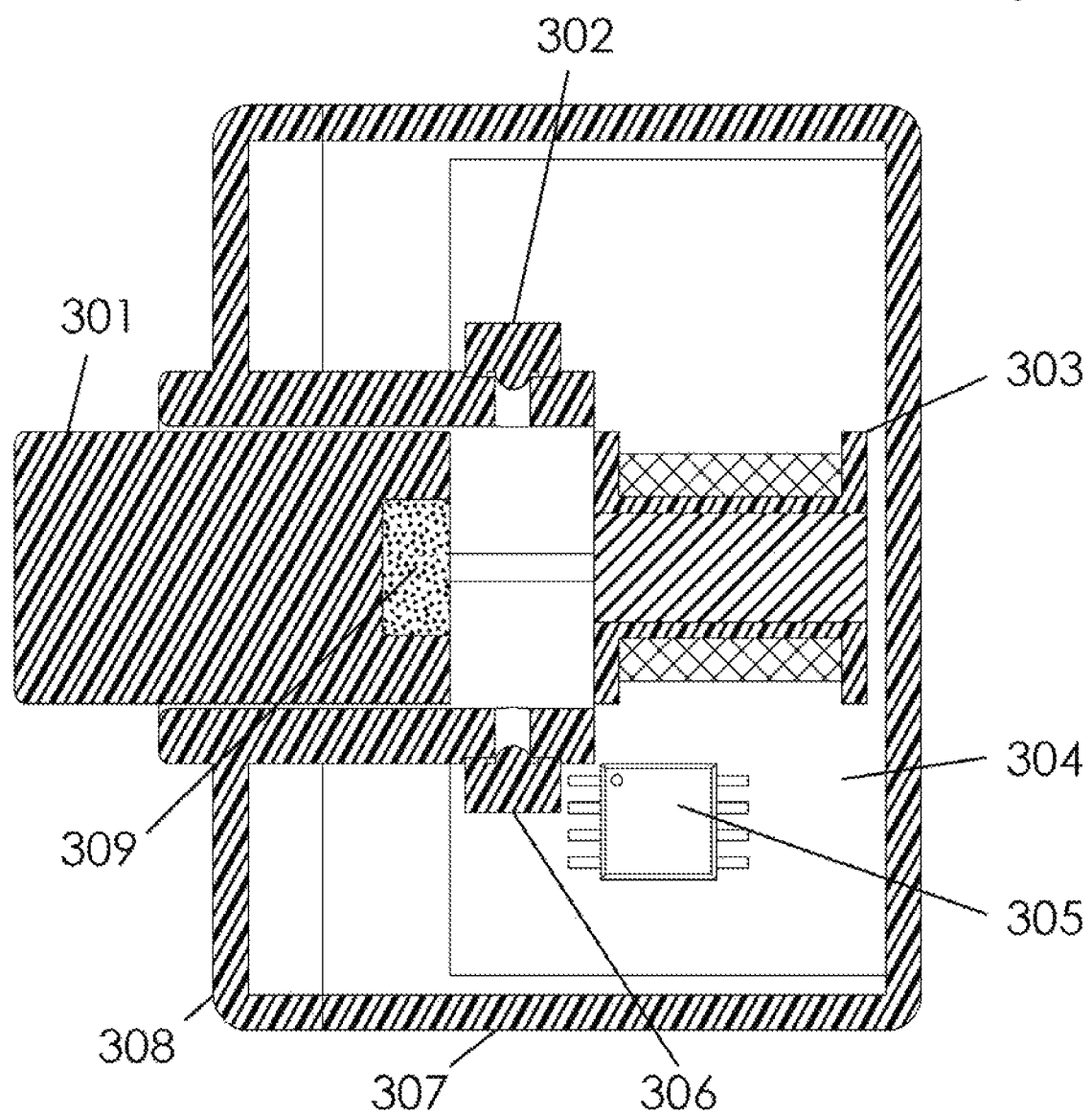
FIG. 3B is a side cross-sectional view of the switch taken along cutline 3B-3B of FIG. 3C.

The embodiment represented in FIGS. 3A through FIG. 3C is a momentary pushbutton switch. Here, the user may depress the pushbutton 301 to change the output state of the pushbutton switch. A permanent magnet 309 (seen in the cross sectional view of FIG. 3B which itself is the view taken along line 3B-3B shown in FIG. 3C) is embedded in the pushbutton 301 and an electromagnet 303 will be energized to generate a resistive force on the pushbutton 301. A light source 302 sends a beam of light across the interface between the pushbutton 301 and the electromagnet 303 to a light detector 306 positioned opposite the light source 302. When the pushbutton 301 is depressed by a user in the direction of the electromagnet 303 it eventually reaches its midpoint of travel, whereupon the light beam from the light source 302 is interrupted and the light detector 306 changes its output signal to the microcontroller 305.

The haptic feedback provided by the pushbutton 301 is produced by the repelling force of the electromagnet 303 on the permanent magnet 309. When the pushbutton 301 is in a raised position, the microcontroller 305 mounted on the Printed Circuit Board 304 detects the position and controls the electromagnet 303 to continue providing repelling force to keep the pushbutton 301 in the raised position. In this way, when the user places a force (e.g., manually via a user's finger) against the pushbutton 301, there is a countering (i.e., magnetic) force on the pushbutton 301 working against the user's (i.e., manual) force. When the pushbutton 301 reaches the midpoint of the pushbutton's 301 travel, the microcontroller 305 detects (via the aforementioned output signal of the light detector 306) the change in position and controls the electromagnet 303 to reverse polarity and thereby reverse the direction of force (thereby becoming an attractive force) that the electromagnet 303 places on the permanent magnet 309 and subsequently the pushbutton 301. The pushbutton 301 snaps into a depressed position thereby providing the user a clear sensory feedback that the pushbutton 301 has been moved to the desired position. The pushbutton 301 is retained by the attractive force between the ferrous core of the electromagnet 303 and the permanent magnet 309, even when current is removed from the electromagnet 303. As the pushbutton 301 is now in a flush position relative to the body face 308, it is impossible for the user to change the state of the pushbutton. Only the microcontroller 305 may move the pushbutton 301 to a raised position by reversing the polarity on the electromagnet 303, thereby placing a repelling force on the permanent magnet 309 embedded in the pushbutton 301. The body face 308 and body rear 307 are structural elements that serve to securely encase the internal elements.

A further embodiment is provided by combining two such pushbuttons in a single unit and this will be described below. However, it should be noted that this single pushbutton embodiment described above may be implemented in several ways in addition to an on/off switching device for a lighting load. When a given product has a feature that the user can activate and that feature will not be immediately available for the user to activate a second time, this pushbutton design may be used to communicate that state. For example, when a user depresses a "start" button on a clothes dryer to start the drying cycle, depressing the button a second time is an action that has no effect as the drying cycle has already been activated. By employing the above described pushbutton, the machine could communicate to the user that depressing the start button a second time is an unavailable action by maintaining the pushbutton in the lowered position until the drying cycle is interrupted—e.g., by completion of the drying cycle or by service interruption. In another example, some toilets are equipped with a flush mechanism which is triggered electronically by a pushbutton. It may be undesirable for the user to trigger a second flush until the first flush cycle has been completed. This fact that immediately pressing the pushbutton a second time is an invalid operation could be communicated to the user by employing the above described pushbutton and maintaining the pushbutton in the lowered position until the flush cycle is completed. There are applications beyond these examples, and these examples are only given to illustrate potential functionality of the pushbutton design.

Figure 4A:
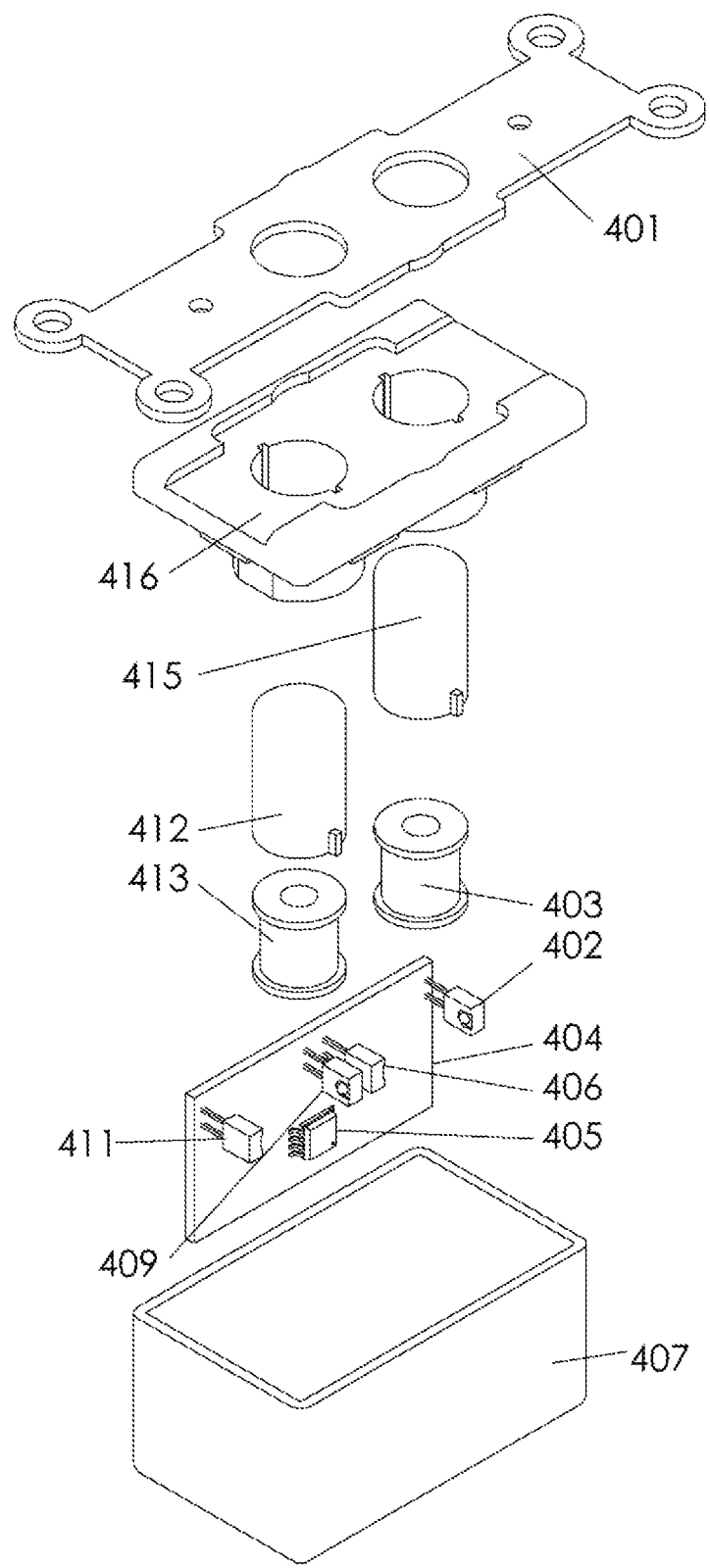
FIG. 4A is a cutaway perspective view of still another (dual momentary pushbutton) embodiment of the present invention.

The embodiment represented in FIGS. 4A through FIG. 4C is a switch made up of two of the aforementioned pushbuttons combined in a single unit. In this configuration, only a single microcontroller 405 and a single Printed Circuit Board (PCB) 404 are necessary. In this configuration, the user will depress the upper button 415 for the "ON" position and depress the lower button 412 to for the "OFF" position. However, it should of course be understood that orientation of the pushbuttons 412, 415 may be altered such that ON and OFF may correspond to right/left, top/bottom, bottom/top depending upon the desired implementation. These pushbuttons 412, 415 serve as a visual indicator to the user because the position of the pushbuttons 412, 415 correspond with the energization state of the lighting load.

Permanent magnets 408, 414 (seen in the cross sectional view of FIG. 4B which itself is the view taken along line 4B-4B shown in FIG. 4C) are embedded in the pushbuttons 412, 415 and electromagnets 413, 403 will be selectively energized to generate repelling/attracting forces on the pushbuttons 412, 415. Those of skill in the art will appreciate that the magnetic force may alternatively be supplied with a single horseshoe electromagnet without straying from the intended scope of the present invention. The light source 409 sends a beam of light across the interface between the pushbutton 412 and the electromagnet 413 to a light detector 411 positioned opposite the light source 409. Likewise, the light source 402 sends a beam of light across the interface between the pushbutton 415 and the electromagnet 403 to a light detector 406 positioned opposite the light source 402. When one of the two pushbuttons 412, 415 are depressed by a user in the direction of the respective electromagnet of electromagnets 413, 403 the pushbutton pressed eventually reaches its midpoint of travel, whereupon the light beam from the respective light source 409, 402 is interrupted and the respective light detector of light detectors 411, 406 changes its output signal to the microcontroller 405.

When the pushbutton of the two pushbuttons 412, 415 which is in a raised position is depressed by the user, the microcontroller 405 will detect the change in output of the respective light detector 411, 406. The microcontroller 405 will reverse the polarity of both electromagnets 413, 403 to simultaneously snap the pushbutton of pushbuttons 412, 415 which the user is depressing into the depressed position via attracting magnetic force and at the same time forcing that pushbutton of pushbuttons 412, 415 that the user is not depressing into a raised position via repelling magnetic force. The result of this behavior will be the appearance to the user of a toggle behavior. That is to say, when the user depresses the raised pushbutton of pushbuttons 412, 415, the raised pushbutton of pushbuttons 412, 415 will snap into the lowered position at the same time that the lowered pushbutton of pushbuttons 412, 415 will snap into the raised position. Accordingly, these two pushbuttons 412, 415 will also provide the user with haptic feedback similar to the operation described hereinabove with regard to FIGS. 3A through 3C. As before, the pushbuttons 412, 415 provide snap action by resisting the movement of the user until the respective pushbutton of pushbuttons 412, 415 reaches the midway of the respective pushbutton's travel, where such pushbutton snaps into the position that the user is moving such pushbutton.

The switch face 416, mounting plate 401, and switch body 407 are structural elements that serve to securely encase the internal elements and provide a manner commonly understood within the electrical art by which to mount the switch.

Figure 5A:
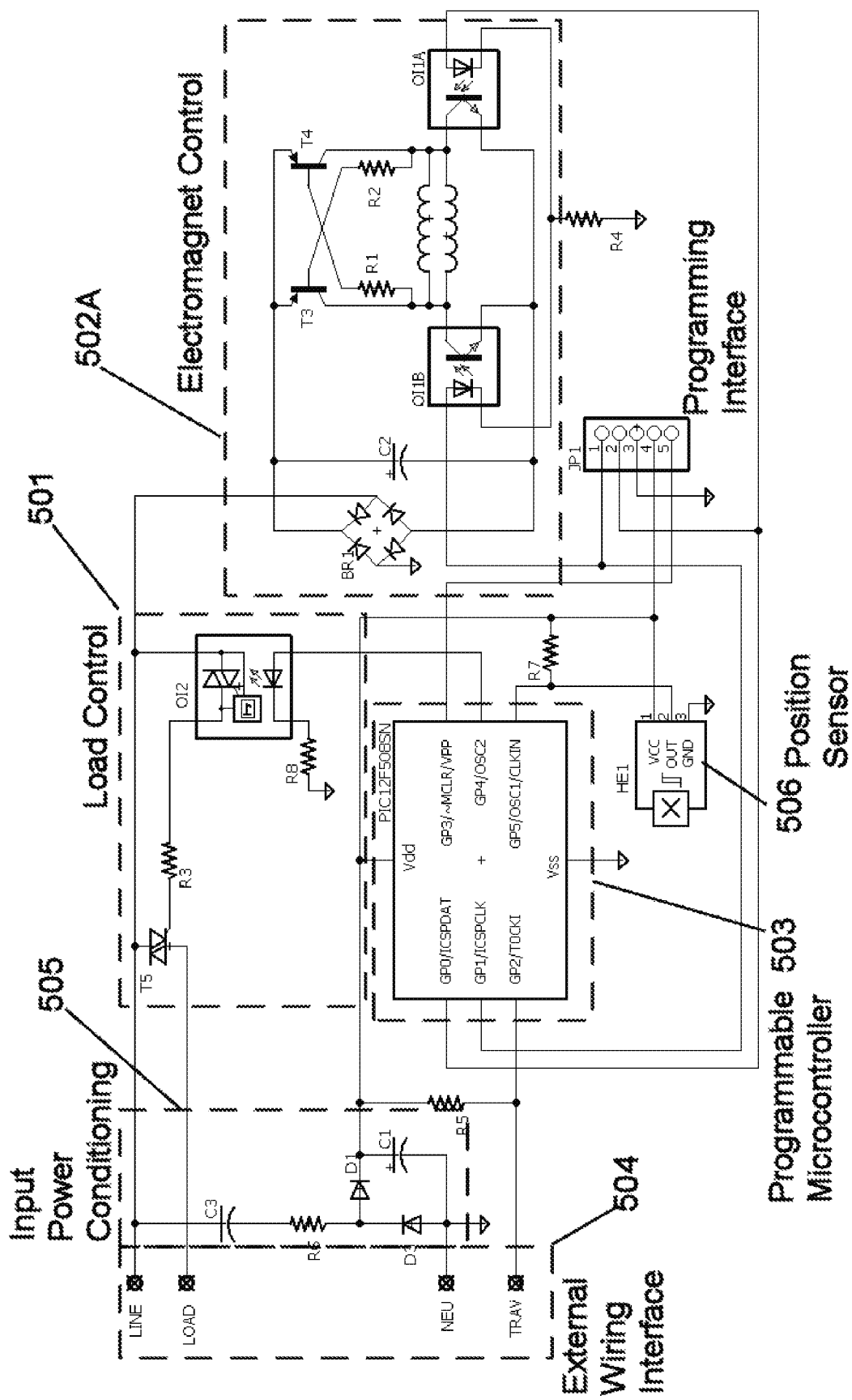
FIG. 5A is a circuit diagram in accordance with one possible implementation of the present invention.
Figure 5B:
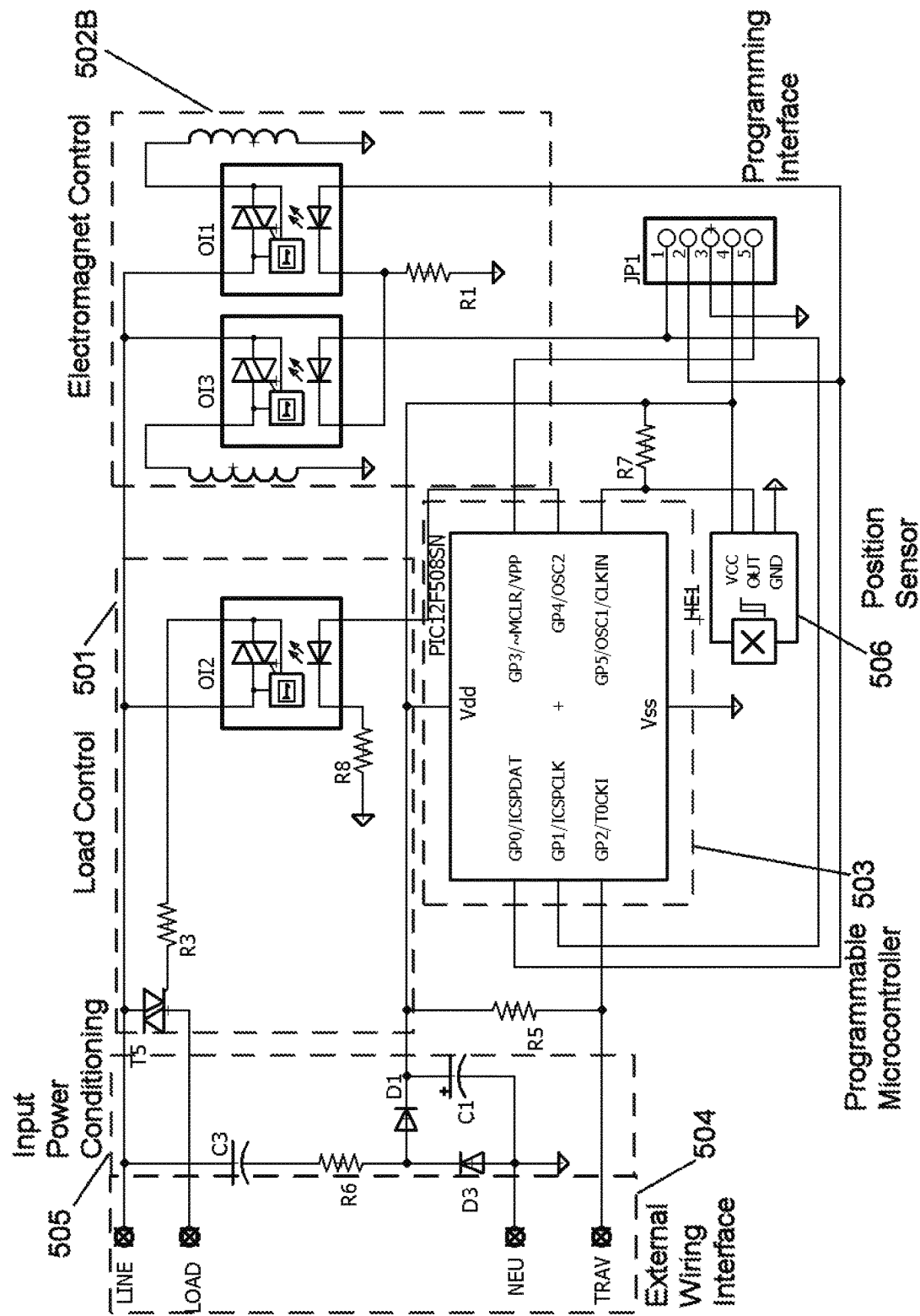
FIG. 5B is a circuit diagram in accordance with another possible implementation of the present invention.

FIG. 5A is a schematic diagram of the circuit which resides on PCBs 104, 304, 404 of the inventive switches shown in FIGS. 1A through FIG. 1C, FIGS. 3A through FIG. 3C, and FIGS. 4A through FIG. 4C. FIG. 5B is a schematic diagram of the circuit which resides on the PCB 204 of the inventive switch shown in FIGS. 2A through FIG. 2C. It will be appreciated by those of skill in the art that alternate circuit designs suitable for accomplishing the same tasks may alternatively be employed without straying from the intended scope of the present invention. The design of the schematic in FIG. 5A allows for the control of direct current (DC) polarity in the electromagnetic coils, whereas the design of the schematic in FIG. 5B allows straightforward on/off control of alternating current (AC) in the electromagnetic coils. Modules common to both schematics are like-numbered while electromagnetic control modules 502A and 502B differ accordingly. It should be understood that each module illustrates specific circuit elements though it should be understood that many different circuit elements may be used to satisfy the basic functions of each module outlined below.

With regard to both schematics, the external wiring interface module 504 is where wires are attached which allow the inventive switching device to receive power and communicate with other connected inventive switching devices. The line and neutral connections provide 120VAC which serves to power the device(s) and any connected load (e.g., light fixture). The load connection provides a power source for a load which is controlled via the circuitry of load control module 501. The traveler connection wire previously mentioned is used to communicate among other inventive switches of the same type.

The input power conditioning module 505 converts the input voltage into a voltage level that may be utilized by the programmable microcontroller module 503. The load control module 501 allows the programmable microcontroller module 503 to control the energization of the load. The electromagnet control modules 502A, 502B allows the programmable microcontroller module 503 to control the flow of electrical current through the electromagnets.

The position sensor module 506 detects the position of the toggle element and communicates that information to the programmable microcontroller module 503. It will be appreciated by those of skill in the art that the position sensor module 506 may be in the form of a momentary contact, Hall Effect sensor, light detector, or other sensing device.

In the illustrated embodiment, communication among inventive switches of the same type is accomplished by messaging over a traveler wire in the external wire interface module 504. Those of skill in the art will appreciate that this may alternatively be accomplished by communication over the line/neutral wiring, fiber optic transmission, wireless transmission, etc. without straying from the intended scope of the present invention.

Figure 6:
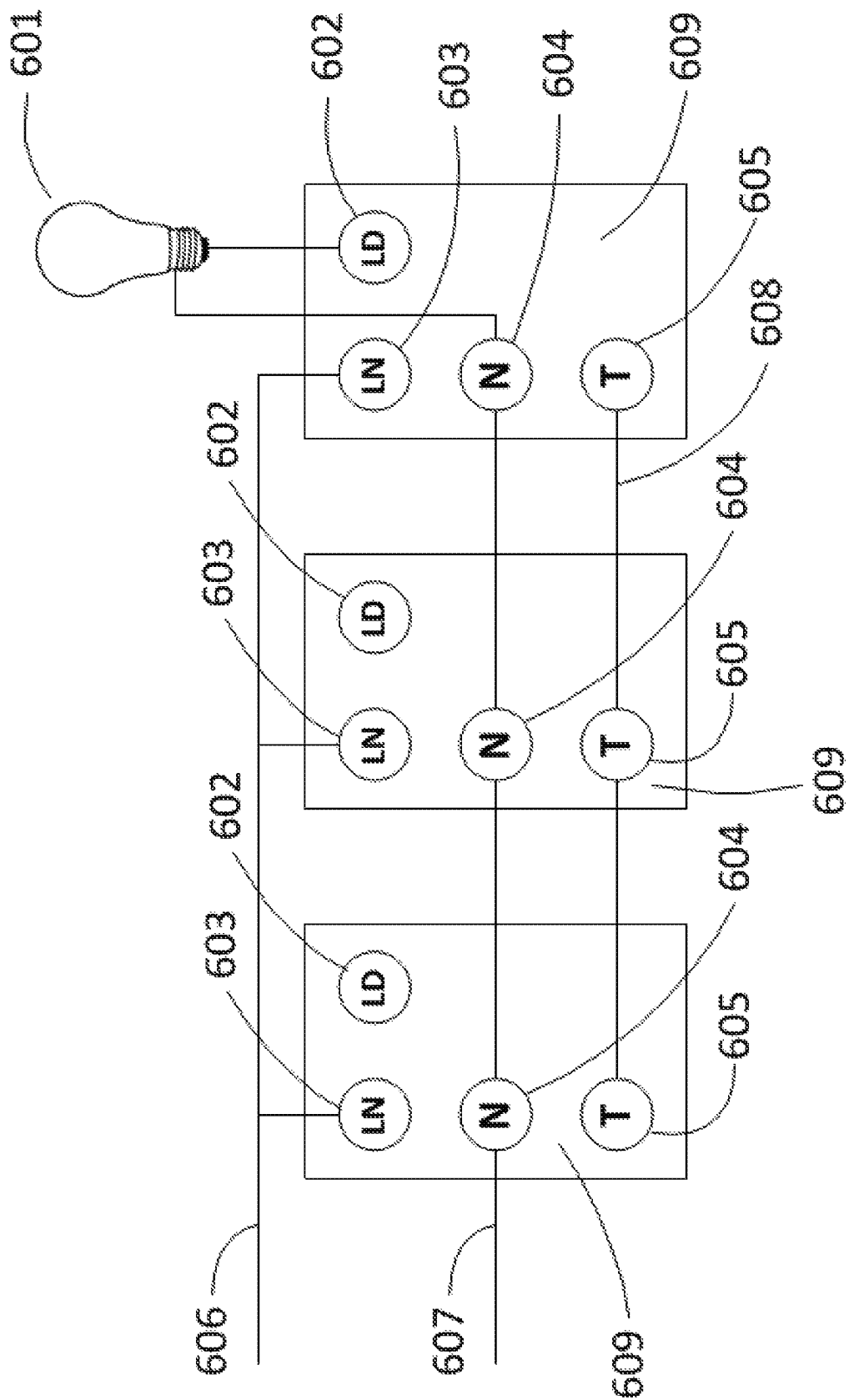
FIG. 6 is a circuit diagram incorporating multiple switches in accordance with the present invention.

In FIG. 6, a generalized schematic is shown illustrating one possible connection configuration of multiple inventive switches of the same type. Here, the arrangement consists of three identical switching devices 609 shown for an example and may be of any of the types shown in FIGS. 1A, 2A, or 4A. It should be understood, however, that there is no limitation on the number of devices 609 in a given circuit wherein a single device or many devices may be used. Each device 609 has a connection labeled LN 603 which is connected to line voltage 606, N 604 which is connected to neutral 607, T 605 which is connected to a common "traveler" 608, and LD 602 which is optionally connected to a load. In the example, a single lighting load 601 is connected to a single load connection 602. Each device 609 has a connection for a load 602, and multiple loads can be connected to each device 609, so it should become readily apparent that there are many configuration possibilities for connecting loads to the switching devices 609 in accordance with the present invention.

In an alternate embodiment, a single switch 609 may contain a load 602 wire while any additional switches may omit the load 602 wire and associated circuitry. In this way, cost could be decreased by omitting components while retaining the functionality of the overall inventive multi-switch system.

It will be noted that although most of this description and as shown in FIG. 6 the invention has discussed the switching of lighting loads, the described devices may be used for loads other than lighting.

Figure 7:
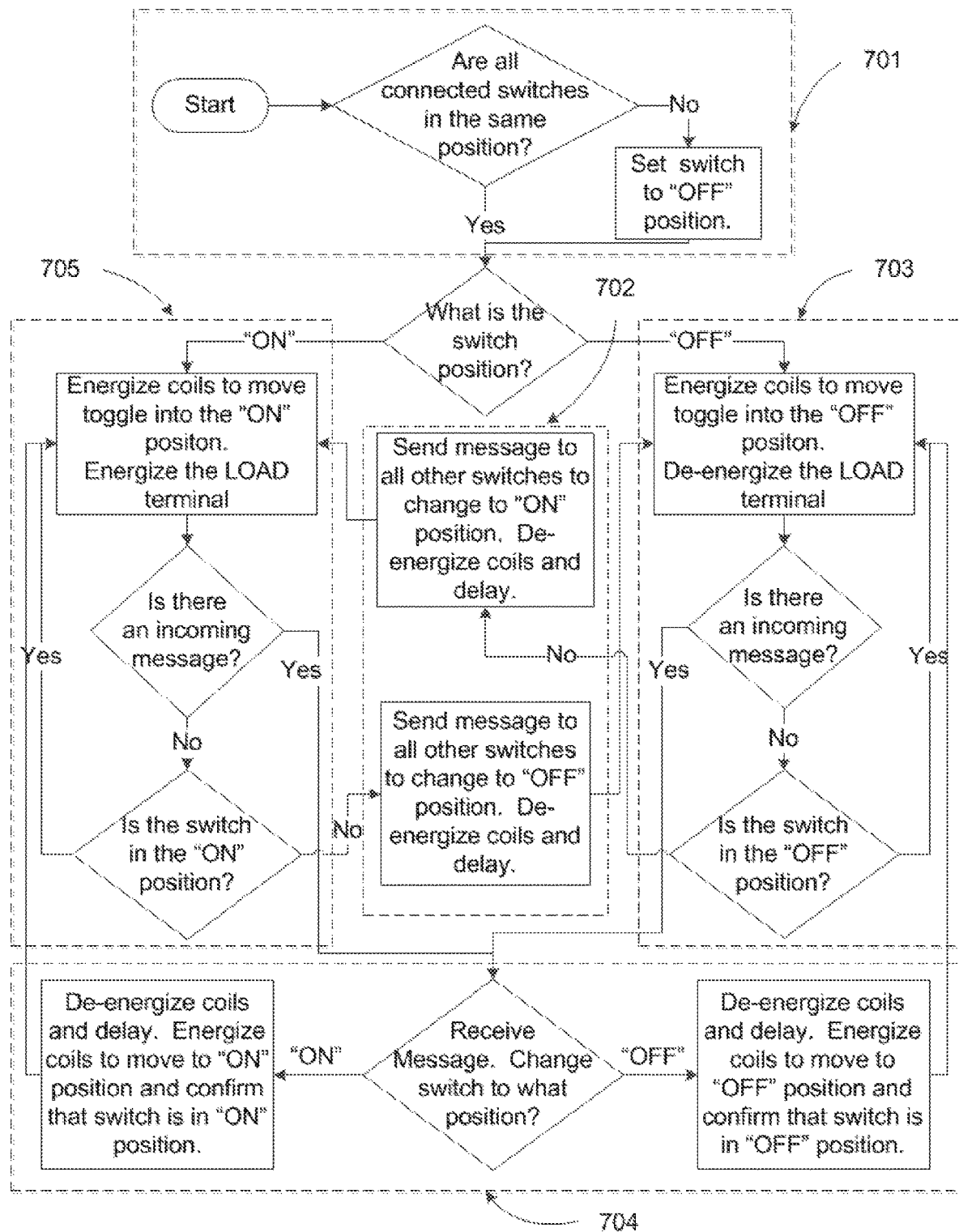
FIG. 7 is a flowchart illustrating the software-based logic resident on the microcontroller within switches in accordance with the present invention.

FIG. 7. is a flow diagram that describes the functionality of the programmable microcontroller discussed herein above.

When power is first supplied to a switch device in accordance with the present invention, the device will go through an initialization routine 701. In the initialization routine 701, the device will communicate with the other devices on the same circuit to determine the position of the attached switch devices. If all the devices have the same position, they will all remain in that position. In this way, if power is interrupted, the switches will remain in the same state when the power is restored. If one or more of the switches' toggle elements are in the raised "ON" position and one or more of the toggle elements are in the lowered "OFF" position, there is a conflict in the switch position and all toggle elements will reset to the lowered "OFF" position.

Following the initialization routine 701, there are two main states in the microcontroller including "ON" and "OFF" shown by an energized "ON" state 705 and a de-energized "OFF" state 703. Transitions between these two states occur on one of two ways. If there is a local change of the toggle element position, the microcontroller makes a state change as the microcontroller sends a message to any attached switches 702. If the microcontroller receives a message from an attached switch to change toggle element position, the microcontroller makes a state change as the microcontroller changes the toggle element position 704.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A switching apparatus for controlling energization of an electrical load, said apparatus comprising:
   a toggle element movable between a first position and a second position, said toggle element including a magnetic element affixed thereto;
   an electromagnetic element being selectively energized and fixed in position relative to said toggle element;
   a sensor creating a signal indicative of said toggle element passing a position midway between said first position and said second position; and
   a microprocessor controlling said electromagnetic element to selectively attract or repel said magnetic element in response to said signal thereby creating sensory feedback to a user of said switching apparatus between energization and de-energization of an electrical load.

2. The switching apparatus as claimed in claim 1 wherein said electromagnetic element includes a first portion and a second portion separated by a space,
   said magnetic element includes a permanent magnet and is arranged within said space, and
   selective energization of said electromagnetic element by said microprocessor alters magnetic flux within said first portion and said second portion so as to impart arcuate movement of said toggle element between said first position and said second position.

3. The switching apparatus as claimed in claim 2 wherein said first portion is a first electromagnet coil and said second portion is a second electromagnet coil.

4. The switching apparatus as claimed in claim 2 wherein said first portion is one end of a single horseshoe electromagnet coil and said second portion is a second end of said single horseshoe electromagnet coil.

5. The switching apparatus as claimed in claim 1 wherein said electromagnetic element includes a first electromagnet coil and a second electromagnet coil separated by a space where said sensor is located,
   said magnetic element includes a first ferrous material block arranged adjacent to said first electromagnet coil and a second ferrous material block arranged adjacent to said second electromagnet coil,
   said toggle element being in operable engagement with said sensor, and
   selective energization of said first electromagnet and said second electromagnet imparts arcuate movement of said toggle element between said first position and said second position.

6. The switching apparatus as claimed in claim 5 wherein said toggle element includes an extension arranged within said space, said extension being in operable engagement with said sensor.

7. The switching apparatus as claimed in claim 1 wherein said electromagnetic element includes an electromagnet coil,
   said magnetic element includes a permanent magnet arranged adjacent to said electromagnet coil; and
   selective energization of said electromagnet coil imparts linear movement of said toggle element between said first position and said second position.

8. The switching apparatus as claimed in claim 1 wherein said toggle element includes a pair of pushbuttons,
   said electromagnetic element includes a pair of electromagnet coils each corresponding to one of said pushbuttons,
   said magnetic element includes a pair of permanent magnets each located within a related one of said pushbuttons and arranged adjacent to a corresponding one of said electromagnet coils; and selective energization of each of said electromagnet coils imparts linear movement of corresponding pushbuttons between said first position and said second position.

9. A system of controlling energization of an electrical load using multiple switch devices, said system comprising:
a plurality of switch devices, each said switch device including
a toggle element movable between a first position and a second position, said toggle element including a magnetic element affixed thereto;
an electromagnetic element being selectively energized and fixed in position relative to said toggle element;
a sensor creating a signal indicative of said toggle element passing a position midway between said first position and said second position;
a communications wire for distributing said signal among said plurality of switches; and
a microprocessor controlling said electromagnetic element to selectively attract or repel each said magnetic element in each of said plurality of switches simultaneously in response to said signal thereby creating sensory feedback to a user of said system;
wherein said plurality of switches are connected via said communications wire.

10. The system as claimed in claim 9 wherein
each said electromagnetic element includes a first portion and a second portion separated by a space,
each said magnetic element includes a permanent magnet and is arranged within said space, and
selective energization of a single pair of said first and second electromagnet coils imparts arcuate movement of all said toggle elements between their respective said first position and said second position.

11. The system as claimed in claim 10 wherein said first portion is a first electromagnet coil and said second portion is a second electromagnet coil.

12. The system as claimed in claim 10 wherein said first portion is one end of a single horseshoe electromagnet coil and said second portion is a second end of said single horseshoe electromagnet coil.

13. The system as claimed in claim 9 wherein
each said electromagnetic element includes a first electromagnet coil and a second electromagnet coil separated by a space,
each said magnetic element includes a first ferrous material block arranged adjacent to a corresponding one of each said first electromagnet coil and a second ferrous material block arranged adjacent to a corresponding one of each said second electromagnet coil;
each said toggle element includes an extension arranged within said space, said extension being in operable engagement with said sensor, and
selective energization of a single pair of said first and second electromagnet coils imparts arcuate movement of all said toggle elements between said first position and said second position.

14. The system as claimed in claim 9 wherein
each said electromagnetic element includes an electromagnet coil,
each said magnetic element includes a permanent magnet arranged adjacent to a corresponding one of each said electromagnet coil; and
selective energization of said electromagnet coil imparts linear movement of said toggle element between said first position and said second position.

15. The system as claimed in claim 9 wherein
said toggle elements each includes a pair of pushbuttons,
said electromagnetic elements each includes a pair of electromagnet coils each corresponding to one of said pushbuttons,
said magnetic elements each includes a pair of permanent magnets each located within a related one of said pushbuttons and arranged adjacent to a corresponding one of said electromagnet coils; and
selective energization of each of said electromagnet coils imparts linear movement of corresponding pushbuttons between said first position and said second position.

* * * * *